(12) United States Patent
Grützner et al.

(10) Patent No.: US 6,398,640 B1
(45) Date of Patent: Jun. 4, 2002

(54) LIGHT-SENSITIVE RESIST WHICH CAN BE DEVELOPED IN AN AQUEOUS-ALKALI MANNER AND OPERATES NEGATIVELY

(75) Inventors: Gabi Grützner; Anja Voigt; Jürgen Bendig; Ines Schmidt; Erika Sauer, all of Berlin (DE)

(73) Assignee: Micro Resist Technology GmbH, Berlin (DE)

( * ) Notice: Subject to any disclaimer, the term of this patent is extended or adjusted under 35 U.S.C. 154(b) by 0 days.

(21) Appl. No.: 09/065,114

(22) PCT Filed: Jun. 5, 1997

(86) PCT No.: PCT/DE97/01176

§ 371 (c)(1),
(2), (4) Date: Oct. 18, 1999

(87) PCT Pub. No.: WO97/46519

PCT Pub. Date: Dec. 11, 1997

(30) Foreign Application Priority Data

Jun. 6, 1996 (DE) .......................................... 196 23 891

(51) Int. Cl.[7] ........................ G03F 7/012; C07C 247/16
(52) U.S. Cl. ....................... 460/196; 430/197; 430/325; 552/8
(58) Field of Search ................................. 430/196, 197, 430/325; 552/8

(56) References Cited

U.S. PATENT DOCUMENTS

| 3,092,494 | A | * | 6/1963 | Sus et al. ..................... 430/197 |
| 4,614,701 | A | * | 9/1986 | Mori et al. .................. 430/175 |
| 4,835,089 | A | | 5/1989 | Iwanayagi et al. .......... 430/323 |
| 4,842,984 | A | * | 6/1989 | Serizawa et al. ............ 430/197 |
| 5,041,570 | A | * | 8/1991 | Tochizawa et al. ......... 430/197 |

FOREIGN PATENT DOCUMENTS

| EP | 297153 | 4/1989 |

* cited by examiner

*Primary Examiner*—John S. Chu
(74) *Attorney, Agent, or Firm*—Goodwin Procter LLP

(57) ABSTRACT

The invention relates top a light sensitive, aqueous alkali developing, negatively acting resist, comprising a phenolic resin as a binder, and a diazostilbene disulfonic acid ester light sensitive component, a solvent or mixture of solvents, and film forming and/or film stabilizing additives, and to a process for preparing the light sensitive component.

16 Claims, No Drawings

LIGHT-SENSITIVE RESIST WHICH CAN BE DEVELOPED IN AN AQUEOUS-ALKALI MANNER AND OPERATES NEGATIVELY

FIELD OF THE INVENTION

The invention relates to a light sensitive, aqueous-alkali developing, negatively functioning resist.

BACKGROUND

The greatest part of commercially available negatively functioning photoresists are in a nonaqueous form. Since in the case of these resists also in the case of resist processing, especially in the development of the illuminated resist areas, special organic solvents have to be used, the interest in their use is constantly reduced due to their increased environmental damage, and their limited performance parameter caused by the swelling of the resist during development (lack of dimensional stability in the transfer of the structural mask in the resist) [H. Böttcher; J. Bendig; M.-A. Fox; G. Hopf; H.-J. Timpe: Technical Applications of Photochemistry, Publ. Verlag für Grundstoffindustrie, Leipzig 1991, p. 178ff].

The Raycast-Series are used as aqueous alkali developing, nonswelling, negatively functioning photoresists [S. Nonogaki: Polym. J. 19 (1987), p. 99], and the Waycoat Resists [M. A. Toukhy; S. F. Mariotte: SPIE Advances in Resist Technology and Processing (1984), p. 86].

The main components of the Raycast-Series (with the resists RD 2000N, 1000N, and RG 3000N) polyvinylphenol (PVPh) is the polymeric binder, a resist-specific azide or bisazide as light sensitive components, and 2-methoxyacetate as solvent. The resist RD 2000N is used in the deep UV-range (DUV). The resists RU 1000N and RG 3000N are most sensitive in the UV range (308 nm, 313/320 nm, 365 nm) respectively in the UV/Vis range (365 nm, 406 nm, 436 nm). The light sensitive components in the resists RU 1000N and RG 3000N have only a limited solubility in the polymer solution, therefore the resists have a low solids content, suitably from 5% to 50% wt., most suitably from 5% to 35% wt. The maximum achievable film thicknesses of the resist applied to a substrate is 2 µm.

PVPh has an excellent solubility, especially in the customary resist solvents but the high production costs represent a great drawback.

The Waycoat-resists are comprised of a novolac base as the polymeric binder. The employed novolac has only a small etching stability compared to basic solutions. The solvent is very toxic. The resist is sensitive in the DUV range.

DESCRIPTION OF THE INVENTION

The object of the invention includes the preparation of a light sensitive, aqueous alkali developing, negatively functioning resist comprised of a polymeric binder having good solubility properties, and a high etching stability, and a light sensitive component, which has a high sensitivity and high photoreactivity over a wide spectral range, and has good solubility characteristics in the polymeric solution, and its light sensitive components can be prepared by an economical process.

The present invention is a light sensitive, acqueous alkali developing, negatively acting resist, comprising a phenolic resin as binder, a light sensitive component of a diazostilbene-disulfonic acid ester of Formula (I)

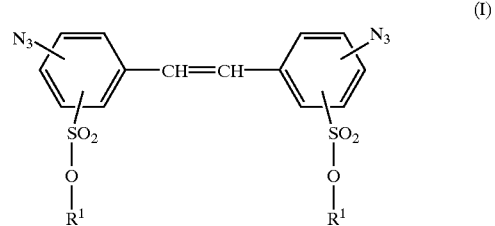

wherein $R^1$ is a residue of Formula (II)

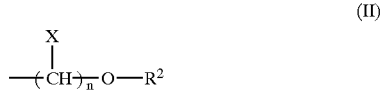

wherein $R^2$ and X are independently of each other hydrogen, or a branched or straight chain alkyl residue, and n is a cardinal number from 1 to 10, a solvent or mixture of solvents, and film forminmg and/or a film stabilizing additive.

The invention also relates to a process for producing the diazostilbene-disulfonic acid ester light sensitive component, which comprises sulfochlorinating a diazostilbene disulfonic acid disodium salt with thionyl chloride, suitably an excess of thionyl chloride, so that a stoichiometric amount of the dimethylformamide based on the amount of the disodium salt is employed, and reacting in the presence of acid binding additives the resulting diazostilbene disulfochloride with an alcohol of Formula III

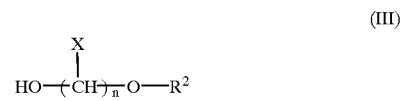

wherein $R^2$ is hydrogen, a branched and unbranched alkyl residue, X is hydrogen, a branched or unbranched alkyl residue, and n is a cardinal number from 1 to 10.

The invention also relates to a process for the lithographic production of negative structures for the µm -and -nm range, characterized in that a photoresist is employed, which comprises a phenolic resin, a light-sensitive component of Formula (I), a solvent or solvent mixture, and film forming or film stabilizing additives, applying the resist as a film to the substrate, the film being suitably formed on the substrate by spincoating, roller coating, moistening coating, spray coating, or dip coating to form a resist film suitably of from 0.3 µm to 10 µm thickness, drying the resist film suitably from 1 minute to 60 minutes ay from 60° C. to 120° C., exposing the resist film to an image in the wavelength range of 200 nm to 400 nm suitably with a high pressure lamp or a laser, developing the film with an aqueous alkaline developer, suitably an alkali metal ion-containing developer at a concentration of from 0.2% wt. to 1.5% wt., or in a metal ion-free developer of a concentration of from 1% wt. to 5% wt. suitably for a period of from 10 to 15 minutes, and drying the resulting structure.

As the polymeric binder, a novolac (phenol-formaldehyde/cresol-formaldehyde condensate) can be employed as an alternative to the PVPh. This novolac is substantially less costly to use; it is soluble in acetone and in aqueous alkaline solutions.

Nontoxic solvents are advantageously used in the resist, suitably in the form of esters, ketones, alcohols or mixtures thereof.

In producing the light sensitive component, suitably p[yridine, NaOH, or a caustic alkali is added to the reaction mixture.

The diazidostilbene-disulfonic acid ester light sensitive component has excellent solubility in the aforementioned solvents and in the polymer solution, which enables a high solids content in the resist. Due to the high photoreactivity and the broad spectral sensitivity of these compounds in the range of 200 to 400 nm (DUV -and UV range) the illumination of the resist layers is possible by using the currently used quartz optics and with the customary glass optics.

The solids content of the resist and thus the content of light sensitive components in the solids is variable within wide ranges so that as desired film thicknesses can be obtained from $0.3 \mu m$ to $10 \mu m$.

The resist can suitably further contain surfactants, smoothers, or adhesives as filmforming and/or film stabilizing additives.

The cost advantageous synthesis of a diazostilbene-disulfonic acid ester light sensitive component can be carried out in a simple two-step process, with high yield.

The use of environmentally friendly and nontoxic, aqueous developers is of particular advantage.

The resist of the invention is suitable for use in standard (AZ-compatible) lithographic processes, to create microstructures to a resolution of <0.5 $\mu m$, which have a high dimensional stability (1:1 transfer of the structure of the mask in the resist), high edge sharpness, and very good etching stability.

The invention is disclosed in more detail by way of the following examples.

EXAMPLE 1

42 g novolac (m-cresol/p-cresol/formaldehyde resin) is stirred at room temperature into the reaction product of 144 g ethyllactate and 0.028 g polyether modified polymethylsiloxane, until the polymer is dissolved and a clear solution is obtained. 14 g 4-4'-diazidostilbene-2,2'-di(sulfonic acid butoxyethylester) is stirred into the solution, until a reddish, clear solution is obtained. 200 g resist is obtained with a solids content of 28% wt.

EXAMPLE 2

84 g novolac (o-cresol/p-cresol/formaldehyde resin) is stirred at room temperature into the reaction product of 145 g ethyllactate and 0.052 g polyether modified polymethyldisiloxane, until the polymer is dissolved and a clear solution is obtained. Then 21 g 4,4'-diazidostilbene-2,2'-di(sulfonic acid butoxyethylester) is stirred into the solution until a clear solution results. 250 g resist is obtained with a solids content of 42% wt.

EXAMPLE 3

124 g poly(p-hydroxystyrene) is dissolved at room temperature with stirring, in the reaction product of 345 g ethylglycolacetate and 0.078 g polyether modified polymethyldisiloxane. Then 31 g 4,4'-diazidostilbene-2,2'-di(sulfonic acid butoxy-ethylester) is stirred in until a clear solution is obtained. 500 g resist is obtained with a solids content of 31% wt.

EXAMPLE 4

82 g novolac is stirred into 409 g ethyllactate modified with 0.044 g polyether modified polydimethylsiloxane until a complete dissolution of the resin, and a clear solution is obtained. Then 7 g 4,4'-diazostilbene-2,2'-di(sulfonic acid ethoxy-ethylester) is stirred in until a clear solution is obtained. 100 g resist is obtained with a solids content of 28% wt.

EXAMPLE 5

Synthesis of the 4,4'-Diazostilbene-2,2'-di(Sulfonic Acid Butoxyethylester)

20 g (0.037 mol) 4,4'-diazostilbene-2,2'-disulfonic acid sodium salt tetrahydrate is reacted in 100 ml (1.39 mol) thionyl chloride in a 250 ml round flask with reflux cooler and gas relief pipe, in approx. 0.2 M NaOH solution) while stirring at room temperature, with 12 ml (0.155 mol) dimethylformamide (DMF). After the reaction is concluded (approx. 2 hours), the thionyl chloride excess is carefully centrifuged off (vacuum, 50° C.), and the yellow mass is poured onto ice water (exhaust!), sucked off, and washed several times with water.

Yield: 17.5 g 4,4'-diazostilbene-2-2'-disulfochloride.

M.P. 195 . . . 197° C., yellow crystals.

Elemental analysis: $C_{14}H_8N_6O_4S_2Cl_2$ (458.9); calc. C 36.6; H 1.74; N 18.4; S 13.9; Cl 15.44; found C 35.5; H 1.89; N 17.8; S 13.9; Cl 14.8.

2.3 g ($5\times10^{-3}$ mol) 4,4'-diazostilbene-2,2'-disulfochloride is suspended in 9.4 g ($8\times10^{-2}$ mol) butoxyhexanol. During the proportional addition of 1.5 g freshly made, fine, powdered KOH the temperature should not exceed 4–5° C. After a 2–3 hour stirring the precipitate is sucked off, washed with water, and recrystallized in ethanol.

Yield: 2.2 g 4,4'-diazostilbene-2,2'-disulfonic acid butoxyethylester).

Elemental analysis $C_{26}H_{34}N_6S_2O_8$ (622.72) calc. C 50.1; H 5.45; N 13.5; S 10.27; found C 49.9; H 5.40; n 13.6; S 10.53.

EXAMPLE 6

Synthesis of the 4,4'Diazostilbene-2,2'-di(Sulfonic Acid Ethoxyethylester)

2.3 g ($5\times10^{-3}$ mol) 4,4'-diazostilbene-2,2'-disulfochloride of Example 5, is suspended in 5.9 g ($8\times10^{-3}$ mol) ethoxyethanol. During the proportional adding of 1.5 g freshly prepared, fine, powdered KOH the temperature should not exceed 4–5° C. After about 2–3 hours of steady stirring the precipitate is sucked off, washed in water, and recrystallized from ethanol.

Yield 2 g 4,4'-diazostilbene-2,2'-di(sulfonic acid ethoxyethylether).

Yellowish-white crystals.

Elemental analysis $C_{33}H_{26}N_6S_3O_8$(566) Calc. C 46.6; H 4.59; N 14.8; S 11.3; Found C 46.9; H 4.39; N 14.6; S 11.63.

EXAMPLE 7

2"-Si wafer is spincoated with a layer thickness of 1.5 $\mu m$ for 30 seconds at 3000 $min^{-1}$ with the resist of Example 1. The layers obtained are dried at 80° C. for 2 minutes on a hotplate, and then exposed to an image with a high pressure mercury vapor lamp (=365 nm) for 60 seconds with a performance density of P=10.8. mW $cm^{-2}$.

The exposed layers are developed in 50 seconds with 0.8% wt NaOH, and dried for 15 seconds with nitrogen.

EXAMPLE 8

Resist layers prepared according to Example 7 are exposed to an image for 40 seconds with a high pressure mercury vapor lamp (=365 nm) with a performance density of P=10.8 mW cm$^{-2}$ and exposed to an image. The exposed layers are developed for 70 seconds with a 2.5% wt. tetramethylammonium hydroxide solution, and dried under a nitrogen current for 15 seconds.

EXAMPLE 9

Resist layers prepared and exposed according to Example 8 are developed for 35 seconds in a 3,3% wt. tetramethylammonium hydroxide solution, and dries for 15 seconds in a nitrogen current.

EXAMPLE 10

4"-Si wafers are spincoated in 30 seconds at 3,000 min$^{-1}$ with a resist according to Example 2 (layer thickness 4.7 μm). The resulting layers are dried for 30 minutes at 95° C. in an oven. Then the layers are exposed for 60 seconds with an image by a high pressure mercury vapor lamp (=365 μm) having a performance density of 9.5 mW cm$^{-2}$.

The exposed layers are developed for 3 minutes with 0.8% wt. NaOH, and dried for 25 seconds in a nitrogen current.

EXAMPLE 11

4"-Si wafers are coated and exposed as in Example 10, and are developed for 4 minutes and 45 seconds with a 2.5% wt. tetramethylammonium hydroxide solution, and dried in a nitrogen current for 25 seconds.

EXAMPLE 12

4"-Si wafers are coated and exposed as in example 10, and then are developed in 3 minutes in a 3.3% wt. tetramethylammonium hydroxide solution, and dried in a nitrogen current for 25 seconds.

What is claimed is:

1. A light sensitive, aqueous alkali developing, negatively acting resist, characterized in that the resist contains a phenolic resin as a binder, a diazostilbene disulfonic acid ester light sensitive component of Formula (I),

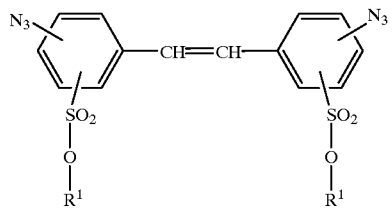

(I)

wherein R$^1$ is a residue of Formula (II)

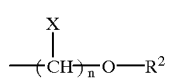

(II)

wherein R$^2$ and X are independently of each other hydrogen or a branched or straight chain alkyl residue, and n is a cardinal number from 1 to 10, a solvent or mixture of solvents, and film forming and/or film stabilizing additives.

2. A light sensitive, aqueous alkali developing, negatively acting resist according to claim 1, characterized in that the resist contains a phenol-formaldehyde- or cresol-formaldehyde condensate or a substituted or unsubstituted polyvinylphenol, or mixtures thereof as a polymeric binder.

3. A light sensitive, aqueous alkali developing, negatively acting resist according to claim 1, characterized in that the resist has a solids content of from 5% to 50% wt.

4. A light sensitive, aqueous alkali developing, negatively acting resist according to claims 1 and 3, characterized in that the resist contains in the light sensitive component a solids content of from 5% wt. to 35% wt.

5. A light sensitive, aqueous alkali developing, negatively acting resist according to claim 1, characterized in that the resist contains esters, ketones, alcohols, aromatics, ethers or mixtures thereof as a solvent.

6. A light sensitive, aqueous alkali developing, negatively acting resist according to claim 1, characterized in that the resist contains surfactants, smoothers, or adhesives, as film forming and/or film stabilizing additives.

7. A process for producing a light sensitive component of Formula (I) of claim 1, for a light sensitive, alkali developing, negatively acting resist, which comprises sulfochlorinating a diazostilbene disulfonic acid disodium salt with thionyl chloride so that a stoichiometric amount of the dimethylformamide based on the amount of the disodium salt is employed, and reacting in the presence of acid binding additives the resulting diazostilbene disulfochloride with an alcohol of formula (III),

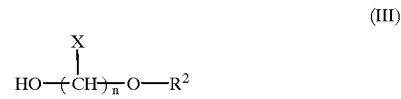

(III)

wherein R$^2$ is hydrogen, a branched and unbranched alkyl, X is hydrogen, branched or unbranched alkyl, and n is from 1 to 10.

8. A process for producing the light sensitive component of claim 7, which comprises employing an excess of thionyl chloride.

9. A process for producing a light sensitive component of claim 7, which comprises adding pyridine, NaOH, or a caustic alkali to the reaction.

10. A process for the lithographic production of negative structures for the μm -and -nm range, characterized in that a photoresist is employed, which comprises a phenolic resin, a light-sensitive component of the general formula I with the values mentioned above for R$^1$, R$^2$, X, and n, a solvent or solvent mixture, and film forming or film stabilizing additives, applying the resist as a film to the substrate, drying the resist film, exposing the resist film to an image in the wavelength range of 200 nm to 400 nm, developing the film with an aqueous alkaline developer, and drying the resulting structure.

11. A process for the lithographic production of negative structures for the μm -and nm range according to claim 10, characterized in that a film is formed on the substrate by spincoating, roller coating, moistening coating, spray coating, or dip coating.

12. A process for lithographic production of negative structures, for the μm -and -nm range according to claim 10, characterized in that in the formation of the film thicknesses of from 0.3 μm to 10 μm are produced.

13. A process for the lithographic production of negative structures for the μm -and -nm range according to claim 11, characterized in that the drying is conducted from 1 minutes to 60 minutes at from 60° C. to 120° C.

14. A process for the lithographic production of negative structures for the μm -and nm range according to claim 10, characterized in that high pressure lamps or lasers are employed for the exposure.

15. A process for the lithographic production of negative structures for the µm -and nm range according to claim 10, characterized in that alkali metal ion-containing developers having a concentration of from 0.2% wt. to 1.5% wt., or metal ion free developers having a concentration of from 1% wt. to 5% wt. are employed.

16. A process for the lithographic production of negative structures for the µm -and nm range according to claims 10 or 15, characterized in that the time employed for development is from 10 seconds to 15 minutes.

* * * * *